United States Patent
Lin et al.

(10) Patent No.: US 10,978,163 B2
(45) Date of Patent: Apr. 13, 2021

(54) VOLTAGE IDENTIFYING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); An-Cheng Liu, Taipei (TW); Szu-Wei Chen, New Taipei (TW); Yu-Siang Yang, New Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/601,517

(22) Filed: Oct. 14, 2019

(65) Prior Publication Data
US 2021/0082522 A1  Mar. 18, 2021

(30) Foreign Application Priority Data
Sep. 16, 2019  (TW) .................................. 108133149

(51) Int. Cl.
*G11C 16/26* (2006.01)
*G11C 11/56* (2006.01)
*H03M 7/42* (2006.01)

(52) U.S. Cl.
CPC .......... *G11C 16/26* (2013.01); *G11C 11/5642* (2013.01); *H03M 7/425* (2013.01)

(58) Field of Classification Search
CPC ..... G11C 16/26; G11C 11/5642; G11C 16/08; H03M 7/425
See application file for complete search history.

(56) References Cited

U.S. PATENT DOCUMENTS

2016/0378596 A1* 12/2016 Kim .................... G06F 11/1068
  714/755
2017/0271031 A1* 9/2017 Sharon ................ G06F 11/3058

* cited by examiner

*Primary Examiner* — David Lam
(74) *Attorney, Agent, or Firm* — JCIPRNET

(57) ABSTRACT

A voltage identifying method, a memory controlling circuit unit, and a memory storage device are provided. The method includes: reading a plurality of first memory cells according to a first read voltage group in a plurality of read voltage groups and performing a first decoding operation to generate first verification information; identifying a plurality of second read voltage groups in the plurality of read voltage groups corresponding to a first interval in a plurality of intervals according to the first interval in which the first verification information is located; and reading the plurality of first memory cells by using a third read voltage group in the plurality of second read voltage groups and performing the first decoding operation.

21 Claims, 13 Drawing Sheets

| Interval\Read voltage group | T0 | T1 | T2 | T3 | T4 | T5 | T6 | T7 | T8 | T9 | T10 | T11 | T12 | T13 | T14 | T15 |
|---|---|---|---|---|---|---|---|---|---|---|---|---|---|---|---|---|
| Interval SI_0 | 0 | 1 | 1 | 0 | 1 | 1 | 1 | 1 | 1 | 1 | 1 | 1 | 1 | 1 | 0 | 1 |
| Interval SI_1 | 0 | 1 | 1 | 0 | 1 | 1 | 1 | 1 | 1 | 1 | 1 | 1 | 1 | 1 | 0 | 1 |
| Interval SI_2 | 0 | 1 | 0 | 0 | 1 | 1 | 0 | 1 | 1 | 0 | 1 | 1 | 1 | 1 | 1 | 0 |

IBS  1111111111111111
BS1  0110111111111101
----------------------------------
NBS1 0110111111111101

NBS1 0110111111111101
BS2  1000111000010101
----------------------------------
NBS2 0000111000010101

⋮

NBSn 0000000000000000

FIG. 15

| Reading a plurality of first memory cells according to a first read voltage group in a plurality of read voltage groups and performing a first decoding operation to generate first verification information | ~S1601 |

↓

| Identifying a plurality of second read voltage groups in the plurality of read voltage groups corresponding to a first interval in a plurality of intervals according to the first interval in which the first verification information is located | ~S1603 |

↓

| Reading the plurality of first memory cells by using a third read voltage group in the plurality of second read voltage groups and performing the first decoding operation | ~S1605 |

FIG. 16

VOLTAGE IDENTIFYING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 108133149, filed on Sep. 16, 2019. The entirety of the above-mentioned patent application is hereby incorporated by reference herein and made a part of this specification.

BACKGROUND

1. Technology Field

The invention relates to a voltage identifying method, a memory controlling circuit unit and a memory storage device.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when reading data from the rewritable non-volatile memory module, a memory management circuit may obtain data to be read by performing a hard bit mode decoding operation for decoding. When the hard bit mode decoding operation is being performed, memory cells may be read by using a read voltage and a decoding may be performed. If the decoding is failed, the memory management circuit re-obtains another read voltage, and reads aforesaid memory cells by using said another read voltage so the decoding may be re-performed. If the decoding is failed again and the number of times of re-obtaining the read voltage does not exceed a preset number of times, the memory management circuit re-obtains other read voltage and reads aforesaid memory cells by using the re-obtained read voltage to re-perform the decoding. When the number of times of re-obtaining the read voltage exceeds the preset number of times, the memory management circuit may perform other decoding operation (e.g., a soft bit mode decoding operation) instead.

In particular, the preset number of times described above is usually "a number of read voltages that can be re-obtained", such a number is usually relatively large and consumes a great amount of time in the operations of re-obtaining the read voltage for reading and decoding before the other decoding operation (e.g., a soft bit mode decoding operation) is performed instead. Therefore, how to quickly determine which read voltages will cause the decoding to be failed and avoid using these read voltages for reading so as to reduce the time for performing the hard bit mode decoding operation is one of the problems to be solved by those skilled in the art.

SUMMARY

The invention provides a voltage identifying method, a memory controlling circuit unit and a memory storage device that can be used to quickly determine which read voltages will cause the decoding to be failed and avoid using these read voltages for reading so as to reduce the time for performing the hard bit mode decoding operation.

The invention proposes a voltage identifying method for a rewritable non-volatile memory module. The rewritable non-volatile memory module includes a plurality of memory cells, and the method includes: reading a plurality of first memory cells in the plurality of memory cells according to a first read voltage group in a plurality of read voltage groups and performing a first decoding operation to generate first verification information; identifying a plurality of second read voltage groups in the plurality of read voltage groups corresponding to a first interval in a plurality of intervals according to the first interval in which the first verification information is located; and reading the plurality of first memory cells by using a third read voltage group in the plurality of second read voltage groups and performing the first decoding operation.

The invention proposes a memory controlling circuit unit for a rewritable non-volatile memory module. The rewritable non-volatile memory module includes a plurality of memory cells, and the memory controlling circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured to perform the following operations: reading a plurality of first memory cells in the plurality of memory cells according to a first read voltage group in a plurality of read voltage groups and performing a first decoding operation to generate first verification information; identifying a plurality of second read voltage groups in the plurality of read voltage groups corresponding to a first interval in a plurality of intervals according to the first interval in which the first verification information is located; and reading the plurality of first memory cells by using a third read voltage group in the plurality of second read voltage groups and performing the first decoding operation.

The invention proposes a memory storage device, and the memory storage device includes a connection interface unit, a rewritable non-volatile memory module and a memory controlling circuit unit. The connection interface unit is configured to couple to a host system. The rewritable non-volatile memory module includes a plurality of memory cells. The memory controlling circuit unit is configured to couple to the connection interface unit and the rewritable non-volatile memory module. The memory controlling circuit unit is configured to perform the following operations: reading a plurality of first memory cells in the plurality of memory cells according to a first read voltage group in a plurality of read voltage groups and performing a first decoding operation to generate first verification information; identifying a plurality of second read voltage groups in the plurality of read voltage groups corresponding to a first interval in a plurality of intervals according to the first interval in which the first verification information is located; and reading the plurality of first memory cells by using a third read voltage group in the plurality of second read voltage groups and performing the first decoding operation.

Based on the above, the voltage identifying method, the memory controlling circuit unit and the memory storage device of the invention can be used to quickly determine which read voltage groups will cause the decoding to be failed and avoid using these read voltage groups for reading the memory cells so as to reduce the time for performing the hard bit mode decoding operation.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

FIG. 14 is a schematic diagram illustrating a verification information lookup table according to an exemplary embodiment.

FIG. 15 is a schematic diagram illustrating a logical operation performed on a bit sequence according to an exemplary embodiment.

FIG. 16 is a flowchart illustrating a voltage identifying method according to an exemplary embodiment.

DESCRIPTION OF THE EMBODIMENTS

Figure 1:
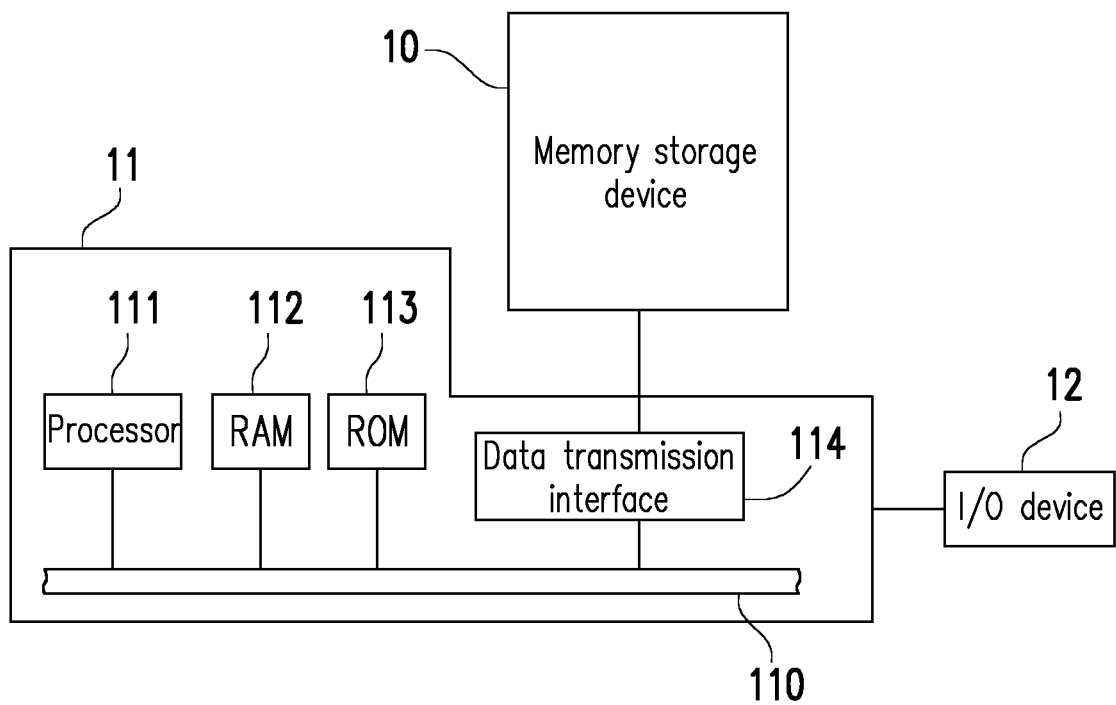
FIG. 1 is a schematic diagram illustrating a host system, a memory storage device and an I/O (input/output) device according to an exemplary embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
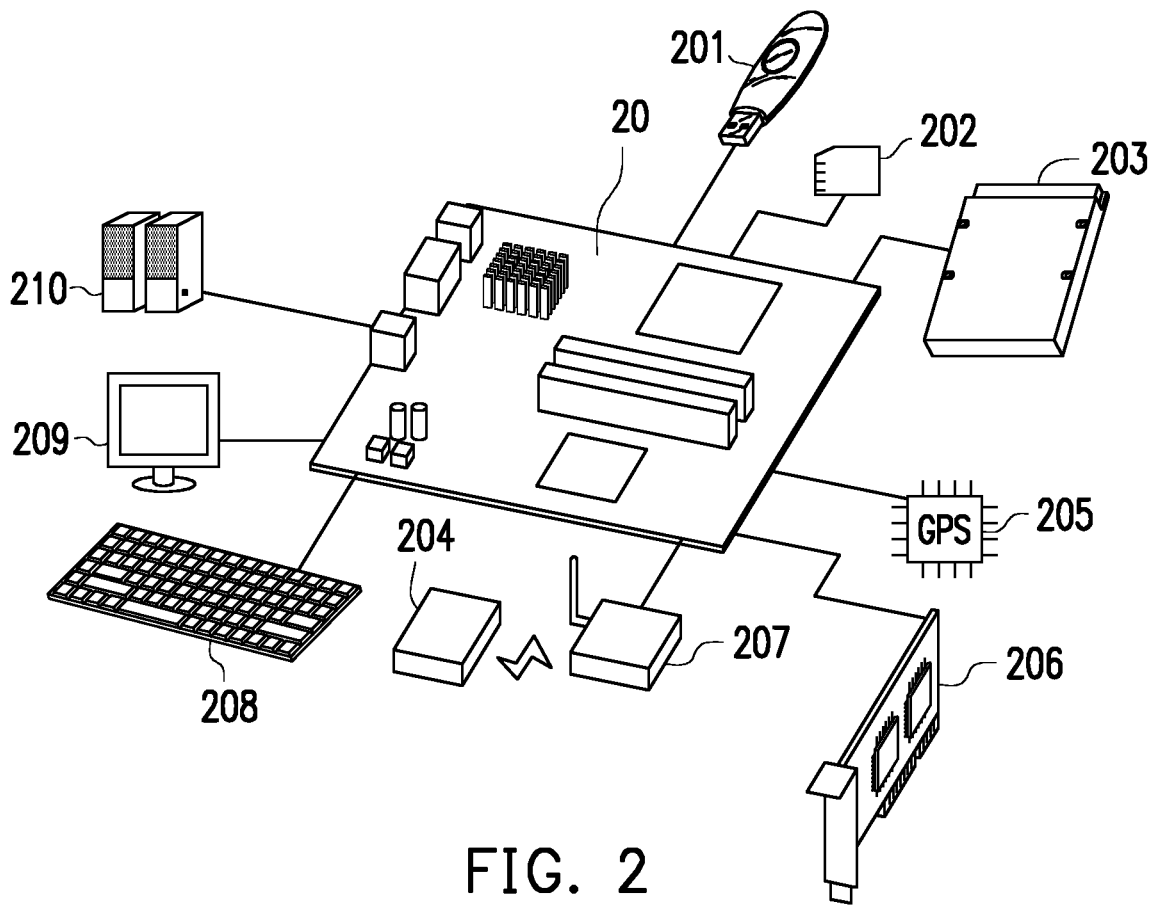
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, an SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
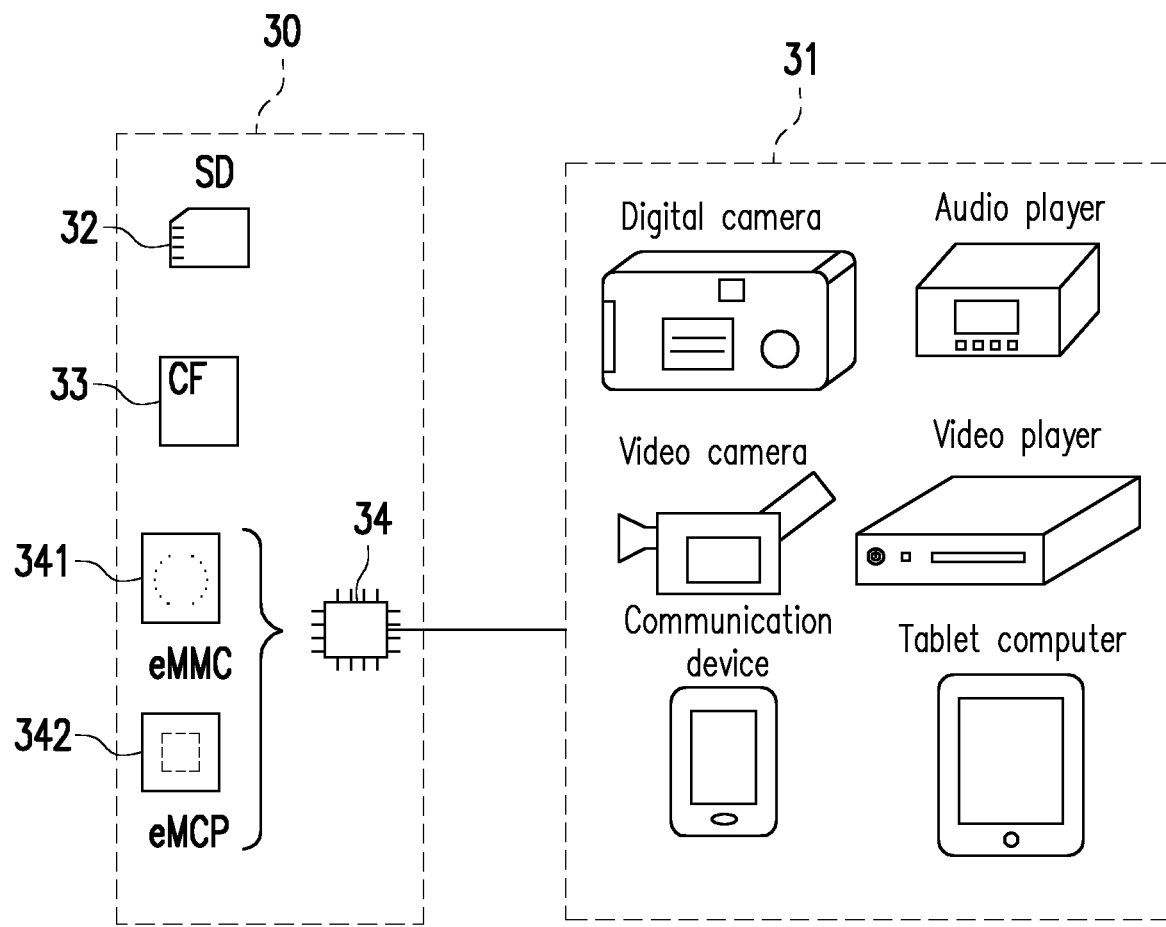
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
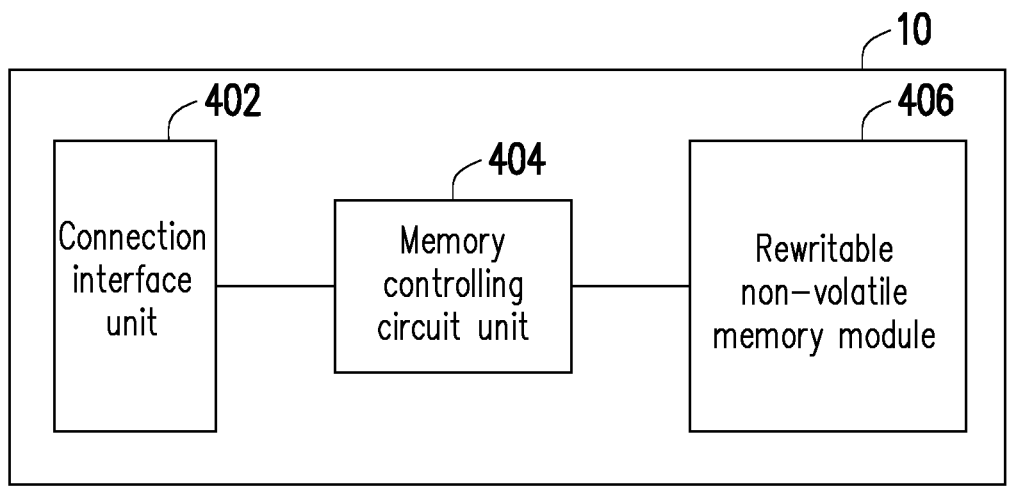
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In this exemplary embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array arranged in a two-dimensional array is taken as an example for description. However, it should be noted that, the following exemplary embodiment is simply an example of the memory cell array. In other exemplary embodiments, a disposition method of the memory cell array may be adjusted to satisfy actual requirements.

Figure 5:
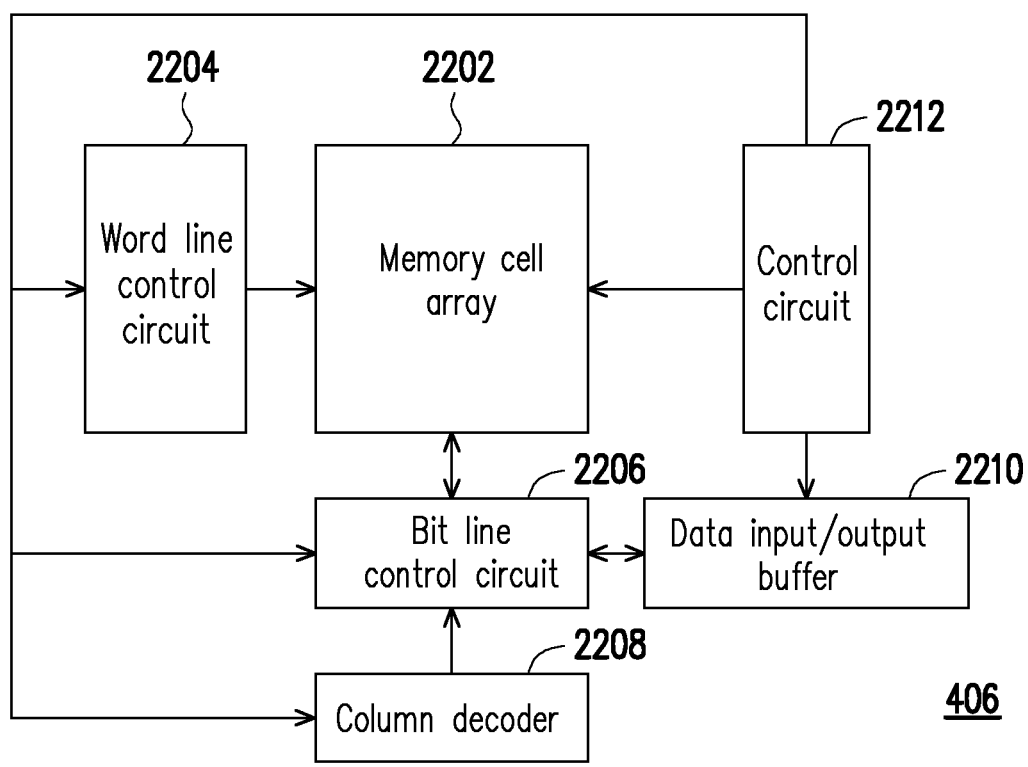
FIG. 5 is a schematic block diagram illustrating a rewritable non-volatile memory module according to an exemplary embodiment.
Figure 6:
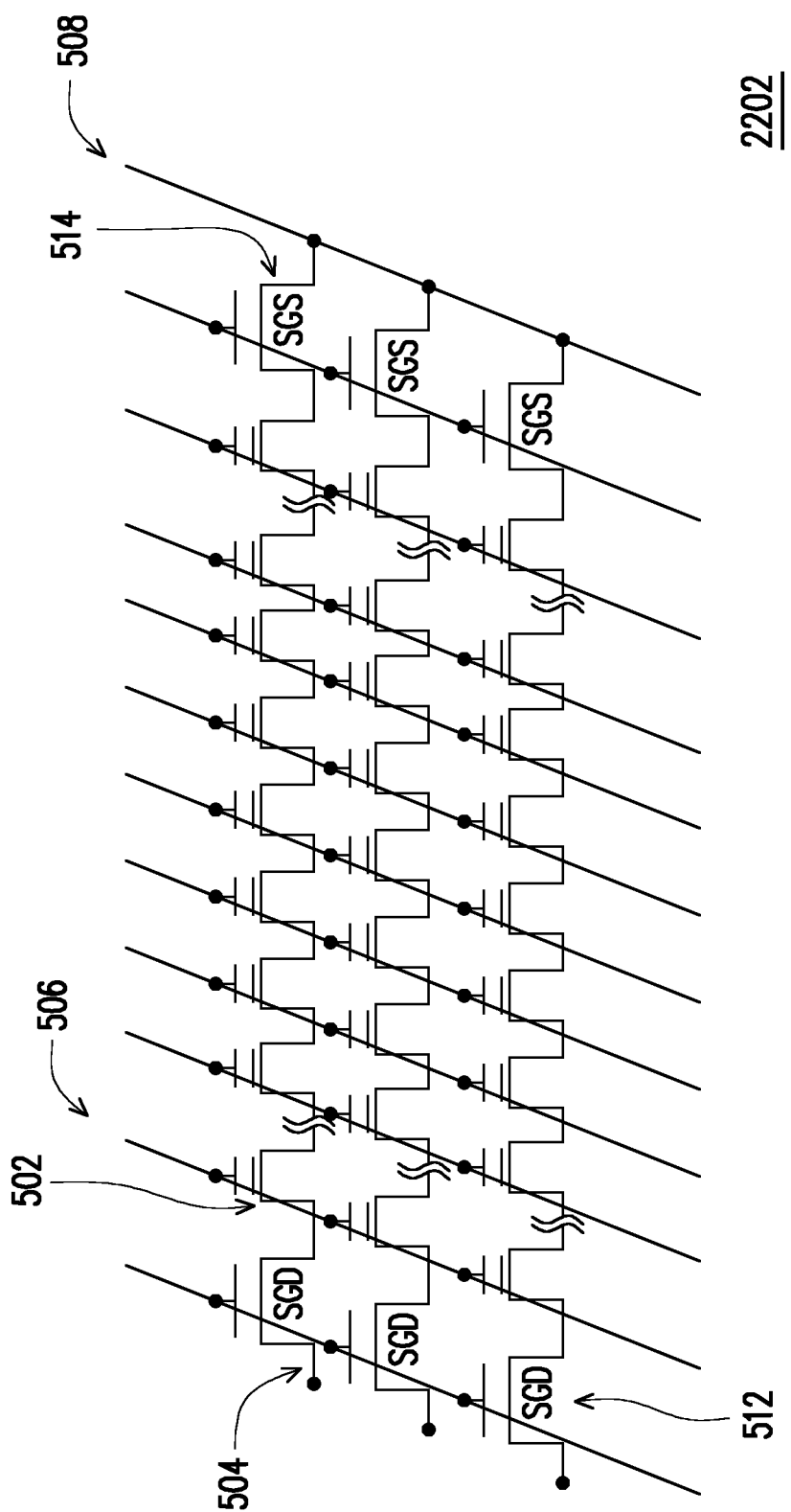
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In this exemplary embodiment, the memory cell array 2202 may include a plurality of memory cells 502 for storing data, a plurality of select gate drain (SGD) transistors 512 and a plurality of select gate source (SGS) transistors 514, as well as a plurality of bit lines 504, a plurality of word lines 506 and a common source line 508 connected to the memory cells (as shown in FIG. 6). The memory cells 502 are disposed at intersections of the bit lines 504 and the word lines 506 in a matrix manner (or in a 3D stacking manner). When a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 stores bits through a change of a threshold voltage. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". With the change of the threshold voltage, each of the memory cells in the memory cell array 2022 has a plurality of storage states. The storage state of the memory cell may be determined through a read voltage, so as to obtain the bits stored by the memory cell.

Figure 7:
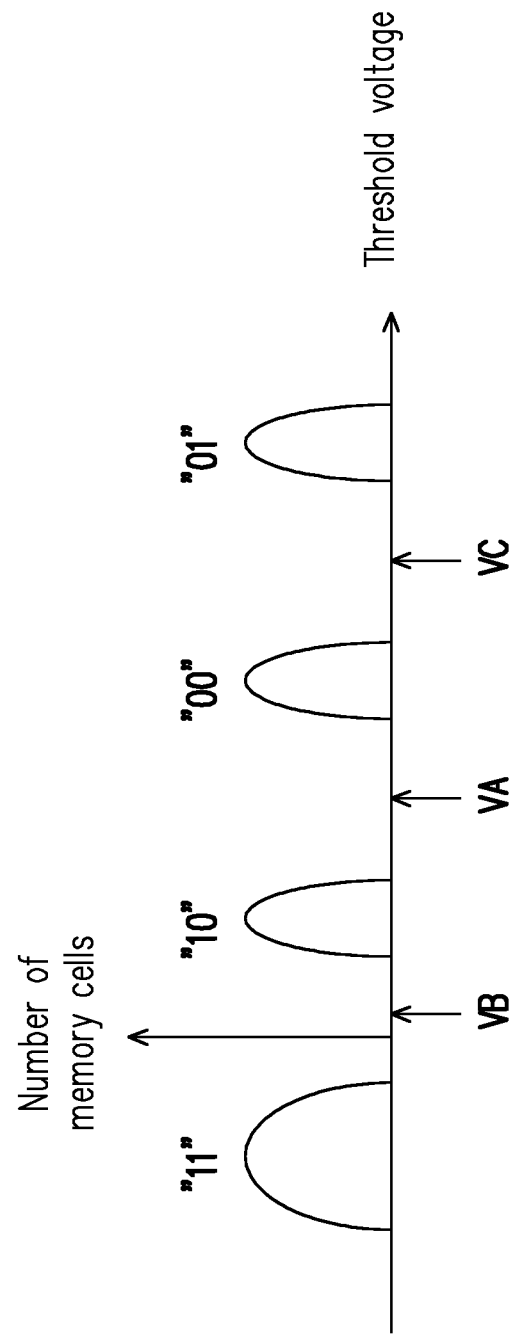
FIG. 7 is a statistical distribution diagram of gate voltages corresponding to write data stored in the memory cell array according to an exemplary embodiment of the invention.

FIG. 7 is a statistical distribution diagram of gate voltages corresponding to write data stored in the memory cell array according to an exemplary embodiment of the invention.

Figure 8:
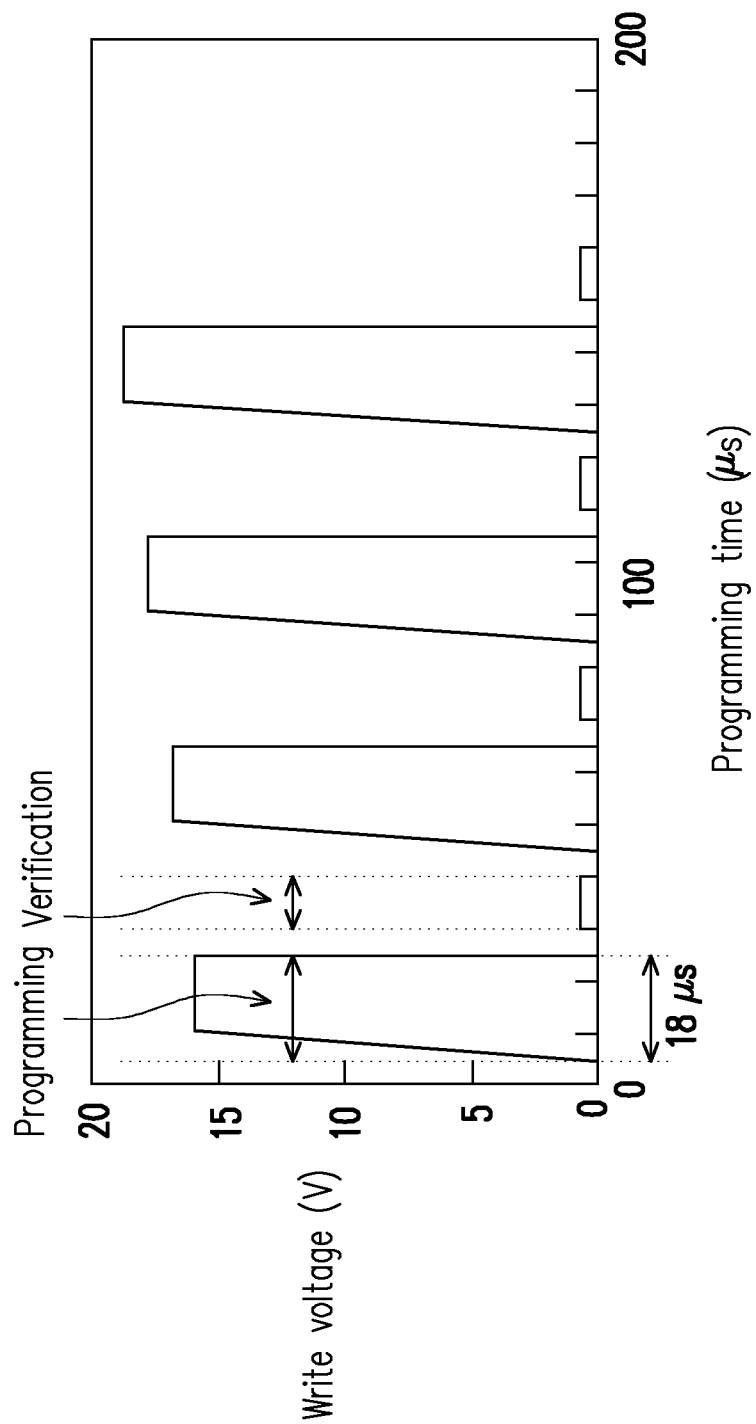
FIG. 8 illustrates a schematic diagram for programming a memory cell according to an exemplary embodiment.

Referring to FIG. 7, an MLC NAND flash memory is taken as an example for description, along with different threshold voltages, each memory cell has four storage states, and the storages states respectively represent bits of "11", "10", "00" and "01". In other words, each of the storage states includes a least significant bit (LSB) and a most significant bit (MSB). In this exemplary embodiment, among the storage states (i.e., "11", "10", "00" and "01"), a first bit counted from the left is the LSB, and a second bit counted from the left is the MSB. Accordingly, in this exemplary embodiment, each of the memory cells may store two bits. It should be understood that, the correspondence between the threshold voltages and the storage states shown in FIG. 8 is only an example. In another exemplary embodiment of the invention, the correspondence between the threshold voltages and the storage states may also be an arrangement of "11", "10", "01" and "00" or other arrangement along with increase of the threshold voltage. Moreover, in another exemplary embodiment, it can also be defined that the first bit counted from the left is the MSB, and the second bit counted from the left is the LSB.

FIG. 8 illustrates a schematic diagram for programming a memory cell according to an exemplary embodiment.

Referring to FIG. 8, in this exemplary embodiment, a programming operation of the memory cell is implemented by using a method of pulse writing/verifying threshold voltage. Specifically, when data is to be written into a memory cell, the memory controlling circuit unit 404 implements a data writing operation by setting an initial write voltage and a write pulse time, and instructs the control circuit 2212 of the rewritable non-volatile memory module 406 to program the memory cell for reading data by using the set initial write voltage and the write pulse time. Then, the memory controlling circuit unit 404 applies a verification voltage to the control gate to determine whether the memory cell is conducted, thereby determining whether the memory cell is in a correct storage state (having a correct threshold voltage). If the memory cell is not programmed to the correct storage state, the memory controlling circuit unit 404 instructs the control circuit 2202 to use the currently-applied write voltage plus an Incremental-step-pulse programming (ISPP) adjusting value as a new write voltage and program the memory cell again by using the new write voltage and the write pulse time. Conversely, if the memory cell is programmed to the correct storage state, it means that the data is correctly written into the memory cell. For example, the initial voltage is set to 16 volts (V), the write pulse time is set to 18 microseconds (μs) and the ISPP adjusting value is set to 0.6V. However, the invention is not limited in this regard.

Figure 9:
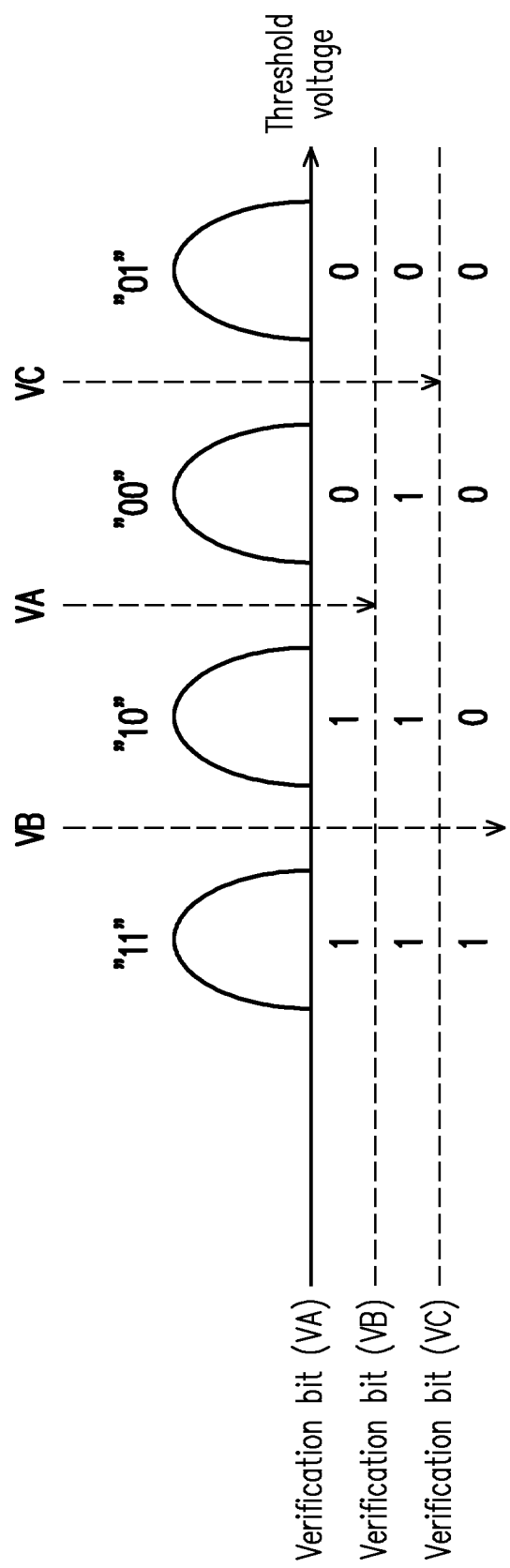
FIG. 9 illustrates a schematic diagram for reading data from a memory cell according to an exemplary embodiment.

FIG. 9 illustrates a schematic diagram of reading data from a memory cell according to an exemplary embodiment, which uses the MLC NAND flash memory for example.

Referring to FIG. 9, a reading operation for the memory cells of the memory cell array 2202 is implemented by applying a read voltage to the control gate, and identifying the data stored in the memory cell through a conduction state of the memory cell. A verification bit (VA) is configured to indicate whether the memory cell is conducted when a read voltage VA is applied; a verification bit (VB) is configured to indicate whether the memory cell is conducted when a read voltage VB is applied; a verification bit (VC) is configured to indicate whether the memory cell is conducted when a read voltage VC is applied. Here, it is assumed that the corresponding memory cell is conducted when the verification bit is "1", and the corresponding memory cell is not conducted when the verification bit is "0". As shown in FIG. 9, the storage states of the memory cell may be determined through the verification bits (VA) to (VC), so as to obtain the stored bits.

Figure 10:
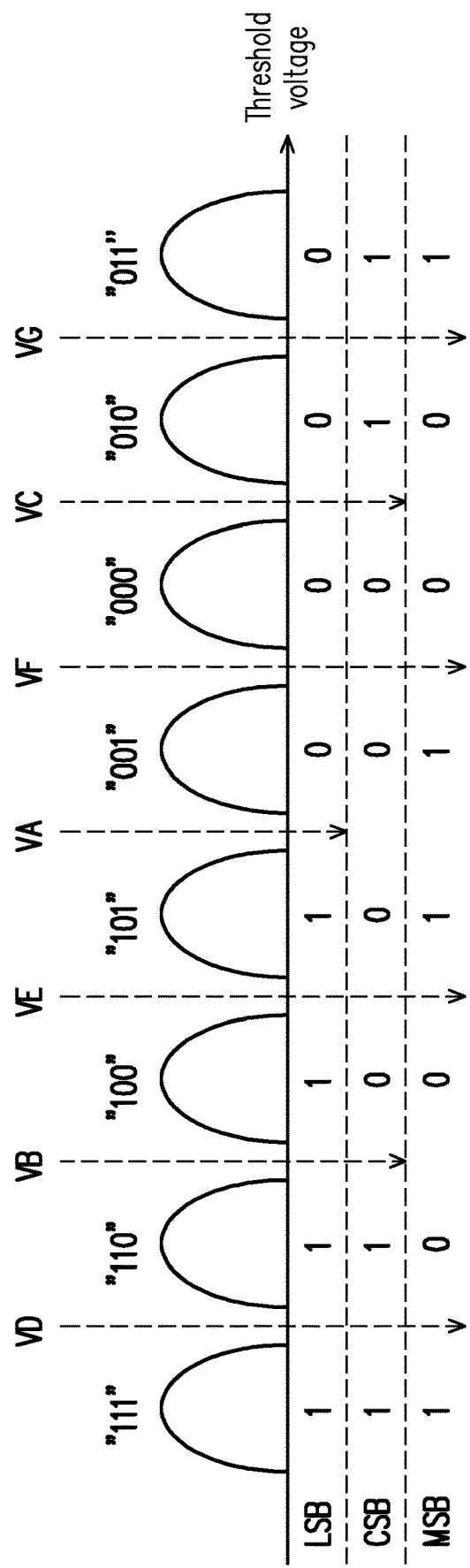
FIG. 10 illustrates a schematic diagram for reading data from a memory cell array according to another exemplary embodiment.

FIG. 10 illustrates a schematic diagram for reading data from a memory cell array according to another exemplary embodiment.

Referring to FIG. 10, a TLC NAND flash memory is taken as an example for description, each of the storages states includes the LSB of the first bit counted from the left, a center significant bit (CSB) of the second bit counted from the left and the MSB of a third bit counted from the left. In this example, according to different threshold voltages, the memory cell has 8 storage states (i.e., "111", "110", "100", "101", "001", "000", "010" and "011"). The bits stored in the memory cell may be identified by applying the read voltages VA to VC to the control gate.

Figure 11:
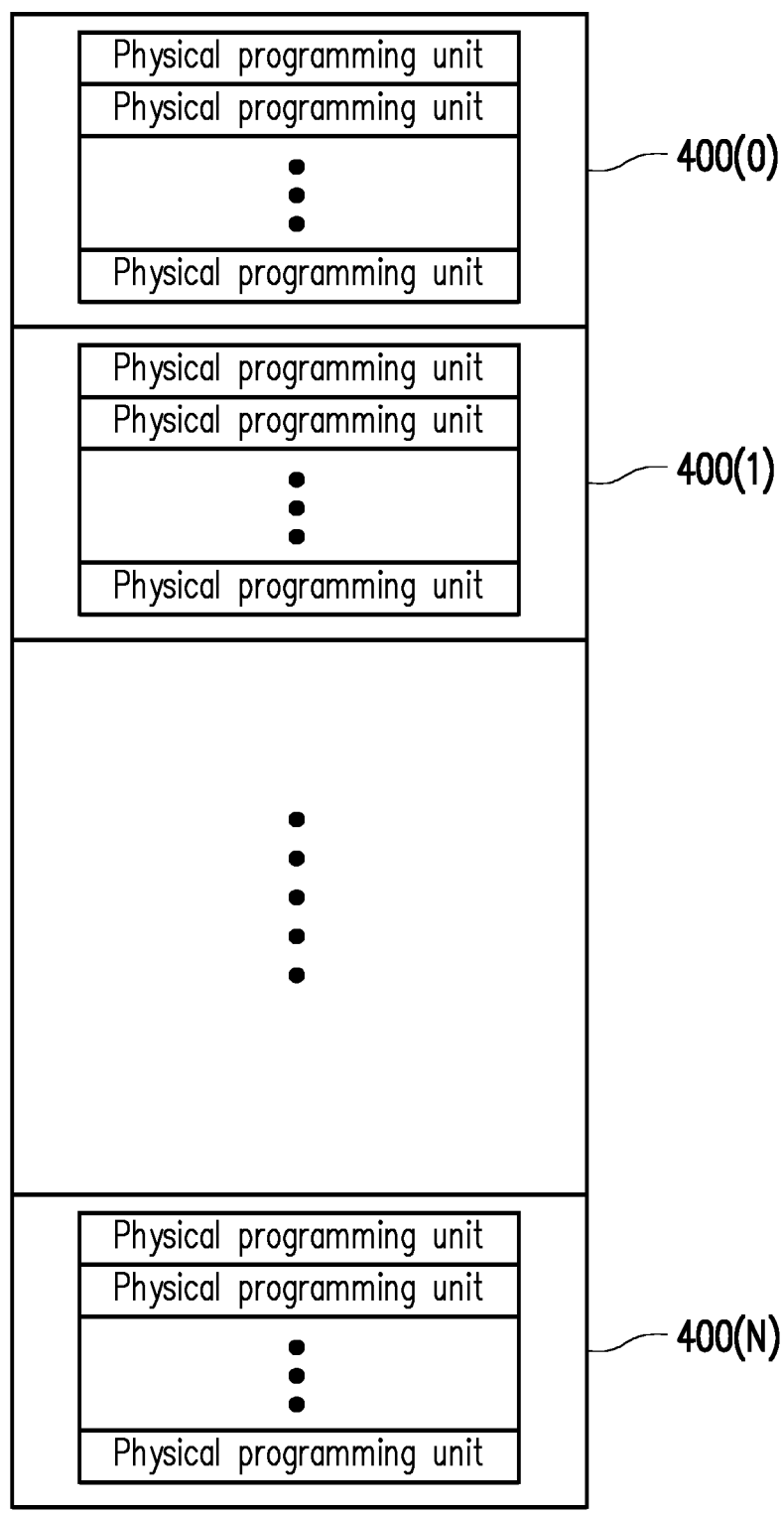
FIG. 11 is a schematic diagram illustrating management of a rewritable non-volatile memory module according to an exemplary embodiment of the invention.

FIG. 11 is a schematic diagram illustrating management of a rewritable non-volatile memory module according to an exemplary embodiment of the invention.

Referring to FIG. 11, the memory cells 502 of the rewritable non-volatile memory module 406 constitute a plurality of physical programming units, and the physical programming units constitute a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is the lower physical programming unit, and the MSB of each memory cell is the upper physical programming unit. In this exemplary embodiment, the physical programming unit is the minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less physical sectors, and the invention is not intended to limit the size and number of the physical sectors. On the other hand, the physical erasing unit is the minimum unit for erasing. That is, each physical erasing unit contains the least number of memory cells to be erased together. For instance, the physical erasing unit is a physical block.

Figure 12:
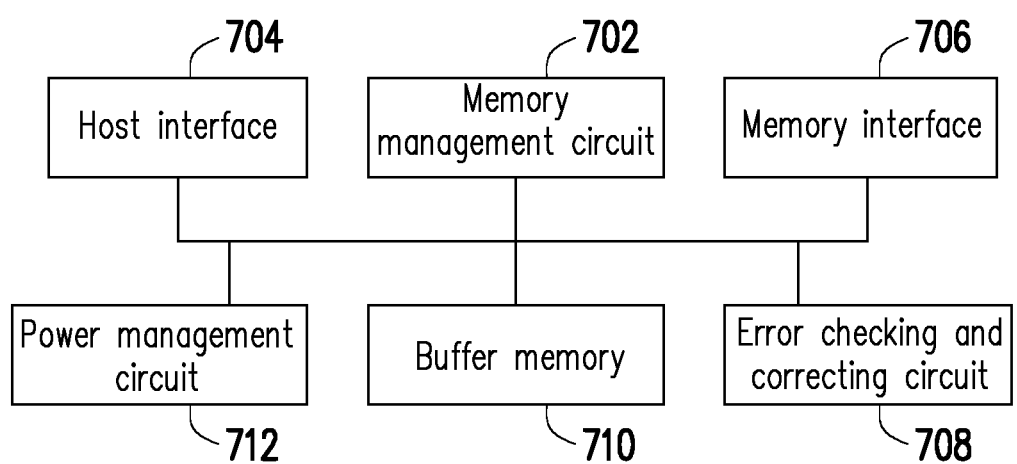
FIG. 12 is a schematic block diagram illustrating a memory controlling circuit unit according to an exemplary embodiment.

FIG. 12 is a schematic block diagram illustrating a memory controlling circuit unit according to an exemplary embodiment. It should be understood that, the structure of the memory controlling circuit unit depicted in FIG. 12 is only an example, and the invention is not limited thereto.

Referring to FIG. 12, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored in form of program codes in a specific area (e.g., a system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 to write data into the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes and instruct the rewritable non-volatile memory module 406 to execute the corresponding operations, such as writing, reading and erasing. In an exemplary embodiment, the memory management circuit 702 may further issue command sequences of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the invention is not limited in this regard. The host interface 704 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 via the memory interface 706, for example. The command sequences may include one or more signals, or data transmitted in the bus. The signals or the data may include command codes and program codes. For example, information such as identification codes and memory addresses are included in the read command sequence.

The error checking and correcting circuit 708 is coupled to the memory management circuit 702 and configured to perform an error checking and correcting operation to ensure integrity of data. Specifically, when the memory management circuit 702 receives the write command from the host system 11, the error checking and correcting circuit 708 generates an error correcting code (ECC) or an error detecting code (EDC) for data corresponding to the write command, and the memory management circuit 702 writes data and the ECC or the EDC corresponding to the write command into the rewritable non-volatile memory module 406. Then, when the memory management circuit 702 reads the data from the rewritable non-volatile memory module 406, the corresponding ECC and/or the EDC are also read, and the error checking and correcting circuit 708 performs the error checking and correcting operation on the read data based on the ECC and/or the EDC.

In an exemplary embodiment of the invention, the memory controlling circuit unit 404 further includes a buffer memory 710 and a power management circuit 712. The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 100.

Figure 13:
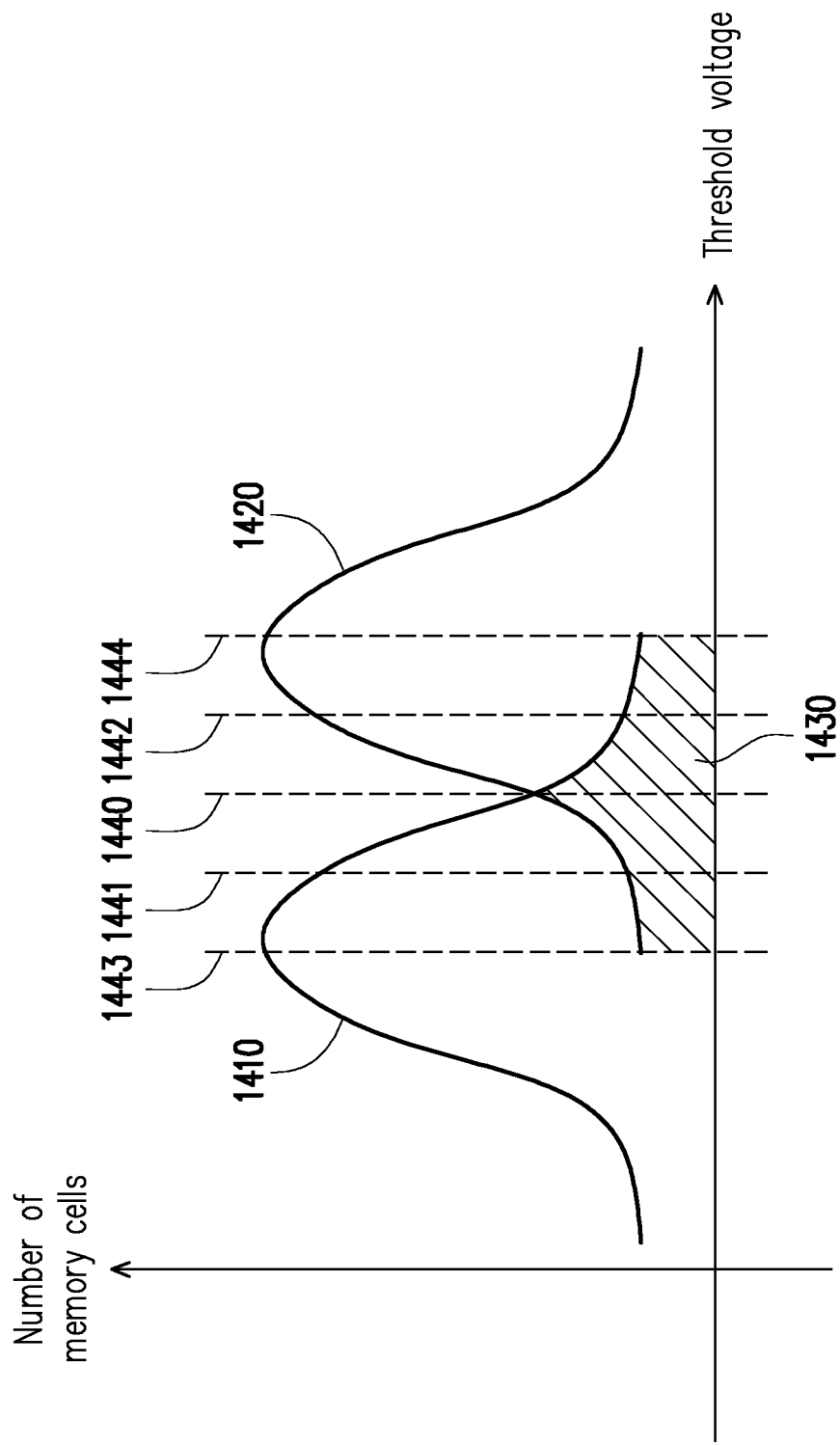
FIG. 13 is a schematic diagram illustrating a hard bit mode decoding according to an exemplary embodiment.

FIG. 13 is a schematic diagram illustrating a hard bit mode decoding according to an exemplary embodiment.

Referring to FIG. 13, an SLC flash memory is taken as an example for description, a distribution 1410 and a distribution 1420 are used for representing storage states of a plurality of first memory cells, and the distribution 1410 and the distribution 1420 respectively represents different storage states. These first memory cells may belong to the same physical programming unit or different physical programming units, and the invention is not limited thereto. Here, it is assumed that when one memory cell belongs to the distribution 1410, the bit stored by that memory cell is "1";

and when one memory cell belongs to the distribution 1420, the bit stored by that memory cell is "0". When the memory management circuit 702 reads the memory cells by using a read voltage 1440, the memory management circuit 702 obtains a verification bit, which is used to indicate whether that memory cell is conducted. Here, it is assumed that the verification bit is "1" when the memory cell is conducted, otherwise it is "0", but the invention is not limited thereto. If the verification bit is "1", the memory management circuit 702 determines that this memory cell belongs to distribution 1410, and belongs to the distribution 1420 otherwise. The distribution 1410 and the distribution 1420 overlap with each other in a region 1430. Namely, some memory cells belonging to the distribution 1410 are recognized as belonging to the distribution 1420, and some memory cells belonging to the distribution 1420 are recognized as belonging to the distribution 1410.

In this exemplary embodiment, when these first memory cells are to be read, the memory management circuit 702 selects a read voltage (e.g., a read voltage 1441) to read the first memory cells to obtain the verification bits of the first memory cells. The error check and correction circuit 708 performs a decoding operation (a.k.a. a first decoding operation) containing a probability decoding algorithm according to the verification bits of the first memory cells to generate a plurality of decoding bits, and the decoding bits may construct a codeword.

In this exemplary embodiment, the probability decoding algorithm is to take a possible decoding result of a symbol as a candidate, and information input during the decoding process or values of an intermediate operation process are indicated by probabilities of the candidates or a ratio of probabilities between the candidates, so as to determine the most possible candidate. For example, if one symbol has two candidates (bits 0 and 1), the probability decoding algorithm is to calculate the most possible candidate according to occurrence probabilities of 0 or 1, or calculate the most possible candidate according to a probability ratio between 0 and 1. It is assumed that there are N candidates, for example, possible values are 0 to N-1 (N is a positive integer, and each candidate represents multiple bits) under a finite field, the probability decoding algorithm is to respectively calculate the probabilities of the N candidates to determine the most possible candidate, or take the probability of one of the values as a denominator to calculate a relative probability ratio to determine the most possible candidate. In an exemplary embodiment, the aforementioned probability ratio may be represented in form of logarithm.

In this exemplary embodiment, the probability decoding algorithm may also be a convolutional code, a turbo code, a low-density parity-check code or other algorithms with probability decoding features. For instance, in the convolutional code and the turbo code, a finite state machine may be applied for encoding and decoding, and the most possible states may be calculated according to the verification bits in this exemplary embodiment, so as to generate the decoding bits. The low-density parity-check code is taken as an example for description.

If the low-density parity-check code is used, when the first decoding operation is performed according to the verification bits, the memory management circuit 702 further obtains a decoding initial value of each memory cell according to each of the verification bits. For example, if the verification bit is "1", the memory management circuit 702 sets the decoding initial value of the corresponding memory cell to n; and if the verification bit is "0", the decoding initial value is −n. Here, n is a positive integer. However, the value of the positive integer n is not particularly limited by the invention. In an embodiment, n is, for example, 8.

Then, the error checking and correcting circuit 708 performs an iterative decoding of the low-density parity-check algorithm according to the decoding initial values to generate a codeword including a plurality of decoding bits. In the iterative decoding, the decoding initial values are continuously updated to represent a probability, and the probability is also referred to as a reliability or a belief. The updated decoding initial values may be converted into a plurality of decoding bits, and the error checking and correcting circuit 708 may take the decoding bits as a vector, and multiply the vector with a module 2 matrix of a parity-check matrix of the low-density parity-check algorithm, so as to obtain a plurality of syndromes. The syndromes may be used for determining whether the codeword composed of the decoding bits is a valid codeword. If the codeword composed of the decoding bits is the valid codeword, the iterative decoding is stopped, and the error checking and correcting circuit 708 outputs the codeword composed of the decoding bits. If the codeword composed of the decoding bits is an invalid codeword, the decoding initial values are continually updated to generate new decoding bits to perform a next iteration. When the number of iterations reaches a predetermined iteration times, the iterative decoding is stopped. The error checking and correcting circuit 708 determines whether the decoding is successful by using the decoding bits generated by the last iteration. For example, if it is determined that the decoding bits generated by the last iteration constitute the valid codeword according to the syndromes, the decoding is successful; and if the first decoding bits constitute the invalid codeword, it means that the decoding is failed.

In another exemplary embodiment, the probability decoding algorithm included in the decoding operation is the convolutional code and the turbo code, and the decoding operation further includes other error correcting codes. For example, the convolutional code and the turbo code may be used in collaboration with a parity code of any algorithm. In the decoding operation, after execution of the decoding part of the convolutional code or the turbo code is completed, the parity code may be used for determining whether the codeword composed of the generated decoding bits is the valid codeword, so as to determine whether the decoding is successful.

Regardless of the type of the used error correcting code, if the decoding is failed, it means that the first memory cells store uncorrectable error bits. If the decoding is failed, the memory management circuit 702 re-obtains another read voltage, and uses the another read voltage (e.g., a read voltage 1442) to read the first memory cells, so as to re-obtain the verification bits of the memory cells. The memory management circuit 702 performs the first decoding operation according to the re-obtained verification bits to obtain another codeword composed of a plurality of decoding bits. In an exemplary embodiment, the error checking and correcting circuit 708 determines whether the another codeword is a valid codeword according to the syndromes corresponding to the another codeword. If the another codeword is not the valid codeword, the memory management circuit 702 determines that the decoding is failed If the number of times of re-obtaining the read voltage is not greater than a preset number of times, the memory management circuit 702 re-obtains other read voltage (e.g., a read voltage 1443), and reads the first memory cells according to the re-obtained read voltage 1443, so as to re-obtain the verification bits and perform the first decoding operation.

In other words, if there are the uncorrectable error bits, by re-obtaining the read voltage, the verification bits of some memory cells are changed, so as to change some probabilities in the probability decoding algorithm, and it accordingly has a chance to change the decoding result of the decoding operation. Logically, the operation of re-obtaining the read voltage is required to flip some bits in one codeword, and re-decode the new codeword. In certain cases, the codeword that cannot be decoded before the flip (there are the uncorrectable error bits) has a chance of being decoded after the flip. Moreover, in an exemplary embodiment, the memory management circuit 702 may attempt the decoding for several times, until the number of attempts exceeds the preset number of times. Nevertheless, the invention is not intended to limit the preset number of times.

It should be noted that although a retry-read mechanism described above is to re-obtain one read voltage, the invention is not limited thereto. In an embodiment applied to the MLC or TLC flash memory, the retry-read mechanism is to obtain a read voltage group, read the memory cell by using a plurality of read voltages in the read voltage group and perform the first decoding operation. In more detail, the memory management circuit 702 pre-configures a preset read voltage group and a plurality of retry-read voltage groups used for the retry-read. When the first memory cell is read for the first time, the memory management circuit 702 may first read the first memory cell by using the read voltages in the preset read voltage group to perform the hard bit mode decoding operation mechanism. When the first memory cells are read by using a first voltage in the preset read voltage group and the decoding is failed, the memory management circuit 702 may perform the retry-read mechanism to select one of the retry-read voltage groups described above for performing a first retry-read and performing the hard bit mode decoding operation. When the decoding is failed in the process of the first retry-read, the memory management circuit 702 may perform a second retry-read. For example, the memory management circuit 702 may select another read voltage group from the retry-read voltage groups described above to read the first memory cells and perform the hard bit mode decoding operation. It should be noted that although the above embodiment performs only two retry-read operations, the invention is not intended to limit the number of times the retry-read is performed. The invention does not limit the use of the SLC, MLC or TLC flash memory. It should be noted that although the foregoing example describes the inclusion of a plurality of read voltages in the read voltage group, the invention is not intended to limit the number of read voltages in the read voltage group. In other embodiments, one read voltage group may also include only one read voltage.

In the exemplary embodiment of FIG. 13, the decoding initial values of the memory cells are divided into two values (e.g., n and −n) according to one verification bit. The iterative decoding executed according to the two values is also referred to as a hard bit mode iterative decoding. However, the step of changing the read voltage may also be applied to a soft bit mode iterative decoding, where the decoding initial values of each memory cell are determined according to a plurality of verification bits. It should be noted that regardless of the hard bit mode or the soft bit mode, the probabilities of the bits are calculated in the iterative decoding, so that the hard bit mode or the soft bit mode all belong to the probability decoding algorithm.

Based on the above, when reading data from the rewritable non-volatile memory module 406, the memory management circuit 702 first obtains data to be read by performing the hard bit mode decoding operation for decoding. When the hard bit mode decoding operation is being performed, a read voltage group may be used to read memory cells and perform the decoding. If the decoding is failed and the number of times of re-obtaining the read voltage group does not exceed the preset number of times, the memory management circuit 702 re-obtains other read voltage group and reads aforesaid memory cells by using the re-obtained read voltage group to re-perform the decoding. When the number of times of re-obtaining the read voltage group exceeds the preset number of times, the memory management circuit 702 may perform other decoding operation (e.g., the soft bit mode decoding operation) instead.

In particular, the preset number of times described above is usually "a number of read voltage groups that can be re-obtained", such a number is usually relatively large in the MLC or TLC flash memory and consumes a great amount of time in the operations of re-obtaining the read voltage group for reading and decoding before the other decoding operation (e.g., a soft bit mode decoding operation) is performed instead.

Therefore, the invention proposes a voltage identifying method that can quickly determine which read voltages will cause the decoding to be failed and avoid using these read voltages for reading so as to reduce the time for performing the hard bit mode decoding operation.

More specifically, in this embodiment, the memory management circuit 702 stores a corresponding verification information lookup table for each read voltage group. For example, FIG. 14 is a schematic diagram illustrating a verification information lookup table according to an exemplary embodiment.

Referring to FIG. 14, it is assumed that in this embodiment, the memory management circuit 702 is configured with read voltage groups T0 to T15. For each read voltage group in the read voltage groups T0 to T15, the memory management circuit 702 pre-stores a corresponding verification information lookup table. Taking the read voltage group T0 as an example, it is assumed that a verification information lookup table 1400 in FIG. 14 is the verification information lookup table corresponding to the read voltage group T0. In the verification information lookup table 1400, relationships between each interval in a plurality of intervals SI_0 to SI_2 and the read voltage groups T0 to T15 may be recorded.

Here, it should be noted that, each interval in the intervals SI_0 to SI_2 is configured to represent a range of verification information (e.g., the syndromes described above). For example, the interval SI_0 represents that values of the syndromes are less than or equal to 600; the interval SI_1 represents that values of the syndromes are greater than 600 and less than 800; the interval SI_2 represents that values of the syndromes are greater than or equal to 800. However, the invention is not intended to limit the number of the intervals and a value range of each interval.

In particular, for each interval in the intervals SI_0 to SI_2, the verification information lookup table 1400 stores a corresponding bit sequence, and a plurality of bits in the bit sequence are respectively corresponding to the read voltage groups T0 to T15. Taking the interval SI_0 in the verification information lookup table 1400 as an example, the bit sequence of the interval SI_0 is "0110111111111101". Among them, the first bit corresponds to the read voltage group T0, the second bit corresponds to the read voltage group T1, the third bit corresponds to the read voltage group T2, and so on and so forth. The read voltage group with a bit value set as 1 (a.k.a. a first bit value) may also be referred to as a "first-type read voltage group", and the read voltage group with a bit value set as 0 (a.k.a. a second bit value) may also be referred to as a "second-type read voltage group". In this embodiment, the "first-type read voltage group" represents the read voltage groups that can be for re-obtaining in the retry-read mechanism, and since these read voltage groups can have a higher probability of successfully decoding the read data (i.e., a probability that the decoding is failed is less than a threshold), the first-type read voltage group may be used for performing the reading operation. The "second-type read voltage group" represents the read voltage groups that are not used for re-obtaining in the retry-read mechanism, and since these read voltage groups have a higher probability of causing the decoding to be failed (i.e., the probability that the decoding is failed is greater than the threshold), the second-type read voltage group are not used for performing the reading operation.

It should be noted that, whether the bit in the bit sequence of each interval needs to be set as 0 or 1 may be determined according to a read voltage distribution diagram in a statistical or experimental manner. Taking the verification information lookup table 1400 of the read voltage group T0 as an example, in the bit sequence of the interval SI_0, the read voltage groups T3 and T14 corresponding to the bits set as 0 are farther from the read voltage group T0 (by a distance greater than a threshold) in the read voltage distribution diagram so that there is a higher probability of causing the decoding to be failed when the read voltage groups T3 and T14 are used for reading. Therefore, the bits corresponding to the read voltage group T3 and T14 (i.e., the fourth and fifteenth bits) in the bit sequence of the interval SI_0 are set as 0. Further, in the read voltage distribution diagram, since the other read voltage groups excluding the read voltage groups T3 and T14 are closer to the read voltage group T0, those read voltage groups can have a higher probability of successfully decoding the read data so that the other read voltage groups excluding the read voltage groups T3 and T14 are set as 1. In addition, because the verification information lookup table 1400 is the verification information lookup table of the read voltage group T0, values corresponding to the read voltage group T0 are ser as 0 to prevent the read voltage group T0 from being repeatedly used in the retry-read mechanism.

Although the foregoing example is described by taking the interval SI_0 in the verification information lookup table 1400 as an example, a similar manner can also be applied to the intervals SI_1 and SI_2 in the verification information lookup table 1400. In addition, the memory management circuit 702 stores the verification information lookup table similar to the verification information check table 1400 for each read voltage group in the read voltage groups T0 to T15.

Later, when the memory management circuit 702 reads the first memory cells in the rewritable non-volatile memory module 406 for the first time, it is assumed that the memory management circuit 702 first reads the first memory cells by using the read voltage group T0 (a.k.a. a first read voltage group) and perform the first decoding operation to generate a syndrome (a.k.a. first verification information). Then, the memory management circuit 702 uses the first verification information to determine whether the decoding is successful (whether the codeword composed of the decoding bits is the valid codeword).

When it is determined that the decoding is failed by using the first verification information (the codeword composed of the decoding bits is not the valid codeword), the retry-read mechanism is performed. More specifically, if the value of the first verification information is 400 (i.e., the value of the syndrome is 400), the memory management circuit 702 determines that the first verification information is located in the interval SI_0 (a.k.a. a first interval) in the verification information lookup table 1400. The memory management circuit 702 obtains the bit sequence (a.k.a. a first bit sequence) corresponding to the interval SI_0 from the verification information lookup table 1400. In particular, since the first memory cells are read for the first time, in this embodiment, the memory management circuit 702 first generates an initial bit sequence IBS with the same length as the first bit sequence, and each bit in the initial bit sequence IBS is 1. Next, the memory management circuit 702 performs a logical operation (e.g., an AND operation) on the initial bit sequence IBS and the first bit sequence.

For example, FIG. 15 is a schematic diagram illustrating a logical operation performed on a bit sequence according to an exemplary embodiment.

Referring to FIG. 15, after a first bit sequence BS1 is obtained, the memory management circuit 702 performs the logical operation on the initial bit sequence IBS and the first bit sequence BS1 to obtain a bit sequence NBS1. In particular, since each bit of the initial bit sequence IBS is 1, the value of each bit in the bit sequence NBS1 is identical to the value of the corresponding bit in the first bit sequence BS1. Then, the memory management circuit 702 identifies the read voltage groups T1, T2, T4 to T13 and T15 corresponding to the bits set as 1 in the bit sequence NBS1 (collectively referred to as second read voltage groups) as the read voltage groups that can be used for reading the first memory cells in the retry-read mechanism; further, the memory management circuit 702 identifies the read voltage groups T0, T3 and T14 corresponding to the bits set as 0 in the bit sequence NB (collectively referred to as fourth read voltage groups) as the read voltage groups that are not used for reading the first memory cells in the retry-read mechanism.

It is assumed that the memory management circuit 702 selects the read voltage group T1 (a.k.a. a third read voltage group) from the read voltage groups T1, T2, T4 to T13 and T15 for re-reading the first memory cells. The first memory cells are re-read by using the read voltage group T1 and the first decoding operation are performed to generate a syndrome (a.k.a. second verification information). The memory management circuit 702 uses the second verification information to determine whether the decoding is successful (whether the codeword composed of the decoding bits is the valid codeword).

When it is determined that the decoding is failed by using the second verification information (the codeword composed of the decoding bits is not the valid codeword), the retry-read mechanism is performed again. More specifically, if the value of the second verification information is 700 (i.e., the value of the syndrome is 700), the memory management circuit 702 determines that the second verification information is located in the interval SI_1 (a.k.a. a second interval) in the verification information lookup table (not illustrated) of the read voltage group T1. The memory management circuit 702 obtains a bit sequence BS2 (a.k.a. a second bit sequence) corresponding to the interval SI_1 from the verification information lookup table of the read voltage group T1. Next, the memory management circuit 702 performs the logical operation on the bit sequence NBS1 (which is identical to the bit sequence BS1) and the bit sequence BS2 to obtain a bit sequence NBS2 (a.k.a. a third bit sequence) shown in FIG. 15. In the example of FIG. 15, since the bit sequence NBS1 is "0110111111111101" and the bit sequence BS2 is "1000111000010101", after the logical operation is performed on them, the bit sequence NBS2 being "0000111000010101" may be obtained.

Then, the memory management circuit 702 identifies the read voltage groups T4 to T6, T11, T13 and T15 corresponding to the bits set as 1 in the bit sequence NBS2 as the read voltage groups that can be used for reading the first memory cells in the retry-read mechanism; further, the memory management circuit 702 identifies the read voltage groups T0 to T3, T7 to T10, T12 and T14 corresponding to the bits set as 0 in the bit sequence NBS2 (collectively referred to as fifth read voltage groups) as the read voltage groups that are not used for reading the first memory cells in the retry-read mechanism. Then, the memory management circuit 702 may read the first memory cells by using one of the read voltage groups T4 to T6, T11, T13 and T15.

In the retry-read mechanism described above, the logical operation of the bit sequence may be performed once when the decoding is failed so as to select a read voltage group for re-reading according to the bit sequence obtained after the logical operation is performed. In particular, when each bit in the bit sequence obtained after the logical operation is performed is 0 (e.g., a bit sequence NBSn in FIG. 15), it means that none of the data read by using the read voltage groups T0 to T15 can be successfully decoded. In this case, the memory management circuit 702 may perform other decoding operation (e.g., the soft bit mode decoding operation) instead. In particular, when the bit corresponding to one specific read voltage group in one specific bit sequence is set as 0, it means that the data read by using that specific read voltage group cannot be successfully decoded. Thus, the memory management circuit 702 can avoid using that specific read voltage group, thereby reducing the time for performing the hard bit mode decoding operation.

FIG. 16 is a flowchart illustrating a voltage identifying method according to an exemplary embodiment.

Referring to FIG. 16, in step S1601, the memory management circuit 702 reads a plurality of first memory cells according to a first read voltage group in a plurality of read voltage groups and performs a first decoding operation to generate first verification information. In step S1603, the memory management circuit 702 identifies a plurality of second read voltage groups in the plurality of read voltage groups corresponding to a first interval in a plurality of intervals according to the first interval in which the first verification information is located. In step S1605, the memory management circuit 702 reads the plurality of first memory cells by using a third read voltage group in the plurality of second read voltage groups and performs the first decoding operation.

In summary, the voltage identifying method, the memory controlling circuit unit and the memory storage device of the invention can be used to quickly determine which read voltage groups will cause the decoding to be failed and avoid using these read voltage groups for reading the memory cells so as to reduce the time for performing the hard bit mode decoding operation.

The previously described exemplary embodiments of the present invention have the advantages aforementioned, wherein the advantages aforementioned not required in all versions of the present invention.

It will be apparent to those skilled in the art that various modifications and variations can be made to the structure of the invention without departing from the scope or spirit of the invention. In view of the foregoing, it is intended that the present invention cover modifications and variations of this invention provided they fall within the scope of the following claims and their equivalents.

What is claimed is:

1. A voltage identifying method for a rewritable non-volatile memory module, wherein the rewritable non-volatile memory module comprises a plurality of memory cells, and the method comprises:
   reading a plurality of first memory cells in the plurality of memory cells according to a first read voltage group in a plurality of read voltage groups and performing a first decoding operation to generate first verification information;
   identifying a plurality of second read voltage groups in the plurality of read voltage groups corresponding to a first interval in a plurality of intervals according to the first interval in which the first verification information is located; and
   reading the plurality of first memory cells by using a third read voltage group in the plurality of second read voltage groups and performing the first decoding operation.

2. The voltage identifying method according to claim 1, wherein the step of identifying the plurality of second read voltage groups corresponding to the first interval in the plurality of read voltage groups comprises:
   identifying a plurality of fourth read voltage groups not used for reading the plurality of first memory cells in the plurality of read voltage groups according to the first interval in the plurality of intervals in which the first verification information is located.

3. The voltage identifying method according to claim 1, wherein before the step of reading the plurality of first memory cells in the plurality of memory cells according to the first read voltage group in the plurality of read voltage groups and performing the first decoding operation to generate the first verification information, the method further comprises:
   storing a verification information lookup table for each read voltage group in the plurality of read voltage groups, wherein the verification information lookup table is configured to record a plurality of first-type read voltage groups and a plurality of second-type read voltage groups of the read voltage group to which the verification information lookup table belongs in the plurality of read voltage groups corresponding to each interval in the plurality of intervals.

4. The voltage identifying method according to claim 3, wherein the verification information lookup table is configured to record a bit sequence corresponding to each interval in the plurality of intervals, a plurality of bits corresponding to the plurality of first-type read voltage groups in the bit sequence are respectively set as a first bit value, and a plurality of bits corresponding to the plurality of second-type read voltage groups in the bit sequence are respectively set as a second bit value.

5. The voltage identifying method according to claim 4, wherein at least one of the plurality of first-type read voltage groups is used for performing a reading operation, and the plurality of second-type read voltage groups are not used for performing the reading operation.

6. The voltage identifying method according to claim 4, wherein the step of identifying the plurality of second read voltage groups corresponding to the first interval in the plurality of read voltage groups comprises:

obtaining a first bit sequence corresponding to the first interval from the verification information lookup table of the first read voltage group, and identifying the plurality of second read voltage groups according to the plurality of bits set as the first bit value in the first bit sequence.

7. The voltage identifying method according to claim 6, wherein the step of reading the plurality of first memory cells by using the third read voltage group in the plurality of second read voltage groups and performing the first decoding operation comprises:

reading the plurality of first memory cells by using the third read voltage group in the plurality of second read voltage groups and performing the first decoding operation to generate second verification information;

obtaining a second bit sequence corresponding to a second interval in the plurality of intervals from the verification information lookup table of the third read voltage group according to the second interval in which the second verification information is located;

performing a logical operation on the first bit sequence and the second bit sequence to obtain a third bit sequence;

identifying a plurality of fifth read voltage groups in the plurality of read voltage groups according to the third bit sequence, wherein a value of bit corresponding to each read voltage group in the plurality of fifth read voltage groups in the third bit sequence is the second bit value, and the plurality of fifth read voltage groups are not used for reading the plurality of first memory cells; and reading the plurality of first memory cells by using a read voltage group excluding the plurality of fifth read voltage groups in the plurality of read voltage groups.

8. A memory controlling circuit unit for a rewritable non-volatile memory module, the rewritable non-volatile memory module comprising a plurality of memory cells, the memory controlling circuit unit comprising:

a host interface, configured to couple to a host system, a memory interface, configured to couple to the rewritable non-volatile memory module; and a memory management circuit, coupled to the host interface and the memory interface, wherein the memory management circuit is configured to read a plurality of first memory cells in the plurality of memory cells according to a first read voltage group in a plurality of read voltage groups and perform a first decoding operation to generate first verification information, wherein the memory management circuit is further configured to identify a plurality of second read voltage groups in the plurality of read voltage groups corresponding to a first interval in a plurality of intervals according to the first interval in which the first verification information is located, wherein the memory management circuit is further configured to read the plurality of first memory cells by using a third read voltage group in the plurality of second read voltage groups and perform the first decoding operation.

9. The memory controlling circuit unit according to claim 8, wherein in the operation of identifying the plurality of second read voltage groups corresponding to the first interval in the plurality of read voltage groups, the memory management circuit is further configured to identify a plurality of fourth read voltage groups not used for reading the plurality of first memory cells in the plurality of read voltage groups according to the first interval in the plurality of intervals in which the first verification information is located.

10. The memory controlling circuit unit according to claim 8, wherein before the operation of reading the plurality of first memory cells in the plurality of memory cells according to the first read voltage group in the plurality of read voltage groups and performing the first decoding operation to generate the first verification information, the memory management circuit is further configured to store a verification information lookup table for each read voltage group in the plurality of read voltage groups, wherein the verification information lookup table is configured to record a plurality of first-type read voltage groups and a plurality of second-type read voltage groups of the read voltage group to which the verification information lookup table belongs in the plurality of read voltage groups corresponding to each interval in the plurality of intervals.

11. The memory controlling circuit unit according to claim 10, wherein the verification information lookup table is configured to record a bit sequence corresponding to each interval in the plurality of intervals, a plurality of bits corresponding to the plurality of first-type read voltage groups in the bit sequence are respectively set as a first bit value, and a plurality of bits corresponding to the plurality of second-type read voltage groups in the bit sequence are respectively set as a second bit value.

12. The memory controlling circuit unit according to claim 11, wherein at least one of the plurality of first-type read voltage groups is used for performing a reading operation, and the plurality of second-type read voltage groups are not used for performing the reading operation.

13. The memory controlling circuit unit according to claim 11, wherein in the operation of identifying the plurality of second read voltage groups corresponding to the first interval in the plurality of read voltage groups, the memory management circuit is further configured to obtain a first bit sequence corresponding to the first interval from the verification information lookup table of the first read voltage group, and identify the plurality of second read voltage groups according to the plurality of bits set as the first bit value in the first bit sequence.

14. The memory controlling circuit unit according to claim 13, wherein in the operation of reading the plurality of first memory cells by using the third read voltage group in the plurality of second read voltage groups and performing the first decoding operation, the memory management circuit is further configured to read the plurality of first memory cells by using the third read voltage group in the plurality of second read voltage groups and perform the first decoding operation to generate second verification information, the memory management circuit is further configured to obtain a second bit sequence corresponding to a second interval in the plurality of intervals from the verification information lookup table of the third read voltage group according to the second interval in which the second verification information is located, the memory management circuit is further configured to perform a logical operation on the first bit sequence and the second bit sequence to obtain a third bit sequence, the memory management circuit is further configured to identify a plurality of fifth read voltage groups in the plurality of read voltage groups according to the third bit sequence, wherein a value of bit corresponding to each read voltage group in the plurality of fifth read voltage groups in the third bit sequence is the second bit value, and the plurality of fifth read voltage groups are not used for reading the plurality of first memory cells, and the memory management circuit is further configured to read the plurality of first memory cells by using a read voltage group excluding the plurality of fifth read voltage groups in the plurality of read voltage groups.

15. A memory storage device, comprising:
a connection interface unit, configured to couple to a host system;
a rewritable non-volatile memory module having a plurality of memory cells; and
a memory controlling circuit unit, coupled to the connection interface unit and the rewritable non-volatile memory module,
wherein the memory controlling circuit unit is configured to read a plurality of first memory cells in the plurality of memory cells according to a first read voltage group in a plurality of read voltage groups and perform a first decoding operation to generate first verification information,
wherein the memory controlling circuit unit is further configured to identify a plurality of second read voltage groups in the plurality of read voltage groups corresponding to a first interval in a plurality of intervals according to the first interval in which the first verification information is located,
wherein the memory controlling circuit unit is further configured to read the plurality of first memory cells by using a third read voltage group in the plurality of second read voltage groups and perform the first decoding operation.

16. The memory storage device according to claim 15, wherein in the operation of identifying the plurality of second read voltage groups corresponding to the first interval in the plurality of read voltage groups,
the memory controlling circuit unit is further configured to identify a plurality of fourth read voltage groups not used for reading the plurality of first memory cells in the plurality of read voltage groups according to the first interval in the plurality of intervals in which the first verification information is located.

17. The memory storage device according to claim 15, wherein before the operation of reading the plurality of first memory cells in the plurality of memory cells according to the first read voltage group in the plurality of read voltage groups and performing the first decoding operation to generate the first verification information,
the memory controlling circuit unit is further configured to store a verification information lookup table for each read voltage group in the plurality of read voltage groups,
wherein the verification information lookup table is configured to record a plurality of first-type read voltage groups and a plurality of second-type read voltage groups of the read voltage group to which the verification information lookup table belongs in the plurality of read voltage groups corresponding to each interval in the plurality of intervals.

18. The memory storage device according to claim 17, wherein the verification information lookup table is configured to record a bit sequence corresponding to each interval in the plurality of intervals, a plurality of bits corresponding to the plurality of first-type read voltage groups in the bit sequence are respectively set as a first bit value, and a plurality of bits corresponding to the plurality of second-type read voltage groups in the bit sequence are respectively set as a second bit value.

19. The memory storage device according to claim 18, wherein at least one of the plurality of first-type read voltage groups is used for performing a reading operation, and the plurality of second-type read voltage groups are not used for performing the reading operation.

20. The memory storage device according to claim 18, wherein in the operation of identifying the plurality of second read voltage groups corresponding to the first interval in the plurality of read voltage groups,
the memory controlling circuit unit is further configured to obtain a first bit sequence corresponding to the first interval from the verification information lookup table of the first read voltage group, and identify the plurality of second read voltage groups according to the plurality of bits set as the first bit value in the first bit sequence.

21. The memory storage device according to claim 20, wherein in the operation of reading the plurality of first memory cells by using the third read voltage group in the plurality of second read voltage groups and performing the first decoding operation,
the memory controlling circuit unit is further configured to read the plurality of first memory cells by using the third read voltage group in the plurality of second read voltage groups and perform the first decoding operation to generate second verification information,
the memory controlling circuit unit is further configured to obtain a second bit sequence corresponding to a second interval in the plurality of intervals from the verification information lookup table of the third read voltage group according to the second interval in which the second verification information is located,
the memory controlling circuit unit is further configured to perform a logical operation on the first bit sequence and the second bit sequence to obtain a third bit sequence,
the memory controlling circuit unit is further configured to identify a plurality of fifth read voltage groups in the plurality of read voltage groups according to the third bit sequence, wherein a value of bit corresponding to each read voltage group in the plurality of fifth read voltage groups in the third bit sequence is the second bit value, and the plurality of fifth read voltage groups are not used for reading the plurality of first memory cells, and
the memory controlling circuit unit is further configured to read the plurality of first memory cells by using a read voltage group excluding the plurality of fifth read voltage groups in the plurality of read voltage groups.

* * * * *